United States Patent
Zhang et al.

(10) Patent No.: US 10,693,484 B1
(45) Date of Patent: Jun. 23, 2020

(54) PIPELINED ANALOG-TO-DIGITAL CONVERTER CALIBRATION

(71) Applicant: Avago Technologies International Sales Pte. Limited, Singapore (SG)

(72) Inventors: Mo Maggie Zhang, Irvine, CA (US); Chun-Ying Chen, Irvine, CA (US); Massimo Brandolini, Mission Viejo, CA (US); Pin-En Su, Irvine, CA (US)

(73) Assignee: AVAGO TECHNOLOGIES INTERNATIONAL SALES PTE. LIMITED, Singapore (SG)

( * ) Notice: Subject to any disclaimer, the term of this patent is extended or adjusted under 35 U.S.C. 154(b) by 0 days.

(21) Appl. No.: 16/359,266

(22) Filed: Mar. 20, 2019

(51) Int. Cl.
*H03M 1/10* (2006.01)
*H03M 1/38* (2006.01)
*H03F 3/04* (2006.01)
*H03M 1/12* (2006.01)
*H03M 1/06* (2006.01)

(52) U.S. Cl.
CPC ............ *H03M 1/1009* (2013.01); *H03F 3/04* (2013.01); *H03M 1/0695* (2013.01); *H03M 1/121* (2013.01); *H03M 1/38* (2013.01)

(58) Field of Classification Search
CPC .. H03M 1/1009; H03M 1/121; H03M 1/0695; H03M 1/38; H03F 3/04
USPC ................................................. 341/120, 161
See application file for complete search history.

(56) References Cited

U.S. PATENT DOCUMENTS 7,595,744 B2 * 9/2009 Agarwal ............. H03M 1/0624
  341/118
9,602,121 B2 * 3/2017 Ali ........................ H03M 1/361

OTHER PUBLICATIONS

C.-Y. Chen et al., "A Low Power 6-bit Flash ADC with Reference Voltage and Common-Mode Calibration," J. Solid-State Circuits, vol. 44. No. 4, pp. 1041-1046, Apr. 2009.
J. Cao et al., "A 500mW ADC-Based CMOS AFE with Digital Calibration for 10Gb/s Serial Links Over KR-Backplane and Multimode Fiber," J. Solid-State Circuits, vol. 45. No. 6, pp. 1172-1185, Jun. 2010.

* cited by examiner

*Primary Examiner* — Khai M Nguyen
(74) *Attorney, Agent, or Firm* — Xsensus LLP (57) ABSTRACT

A method and apparatus for calibrating a pipelined analog-to-digital converter (ADC) is disclosed. A method includes reading a first output level from a first sub-ADC, reading one or more additional output levels from one or more additional sub-ADCs, combining the one or more additional output levels from the one or more additional sub-ADCs into a combined output level, and adjusting a comparator threshold of the first sub-ADC when the first output level and the combined output level meet a set of predetermined conditions.

14 Claims, 8 Drawing Sheets

PIPELINED ANALOG-TO-DIGITAL CONVERTER CALIBRATION

BACKGROUND

Field

This disclosure relates to the field of analog-to-digital converters, devices, components and methods.

Description of the Related Art

An analog-to-digital converter (ADC) is an electronic component that converts an analog voltage or current input to a digital output representing the magnitude of the voltage or current. ADCs are used in many modern electronic devices including video, voice and music recorders; mobile phones; computers; communications equipment; scientific instruments and data acquisition systems.

The flash ADC is a well-known type of analog-to-digital converter. For an N-bit converter, a flash ADC circuit typically uses $2^N-1$ comparators, a resistive-divider (resistor ladder) with $2^N$ resistors to provide a reference voltage for each comparator, and an encoder to convert the comparator outputs (in the so-called "unary" or "thermometer" code) into a binary value. Because of the number of components required, flash ADCs are typically used in applications that require very high conversion rates, low latency, and relatively low resolution (up to about 7 or 8 bits).

A related type of ADC is the so-called pipelined ADC, which employs multiple stages, where each stage typically includes a sample-and-hold circuit, a low resolution flash ADC (herein referred to as a sub-ADC), a digital-to-analog converter, a summer, and an amplifier (the last stage of a pipelined ADC, however, may only include a sub-ADC). In many implementations, the sample-and-hold circuit, the digital-to-analog converter, the summer, and the amplifier are incorporated into a single circuit block referred to as a multiplying digital-to-analog converter. The digital outputs of the stages are combined and time-aligned to yield a high-speed, high throughput, and, often, high resolution converter. One drawback of the pipelined ADC is higher latency than a single stage flash ADC of the same resolution.

In a pipelined ADC, mismatch (errors in the resistor ladder and/or comparator offsets) in one or more of the sub-ADCs may result in output nonlinearity (e.g., stuck codes, missing codes) and cause performance degradation. Calibration of the mismatch may be performed in the foreground, but this interrupts normal ADC operation. Increasing the size of the circuitry may improve the matching, but this may require significant chip area and power for high resolution pipelined ADCs.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology is not limited to the specific details set forth herein and may be practiced using one or more implementations. In one or more instances, structures and components are shown in simplified form in order to avoid obscuring the concepts of the subject technology.

Referring now to the drawings, wherein like reference numerals designate identical or corresponding parts throughout the several views, exemplary aspects of the disclosure include a self-calibrating pipelined ADC without additional components in the signal path or a training signal. In some embodiments, digital codes generated by sub-ADCs in subsequent stages of the self-calibrating pipelined ADC and the corresponding sub-ADC data are used to adjust the sub-ADC comparator thresholds to remove offsets.

Figure 1:
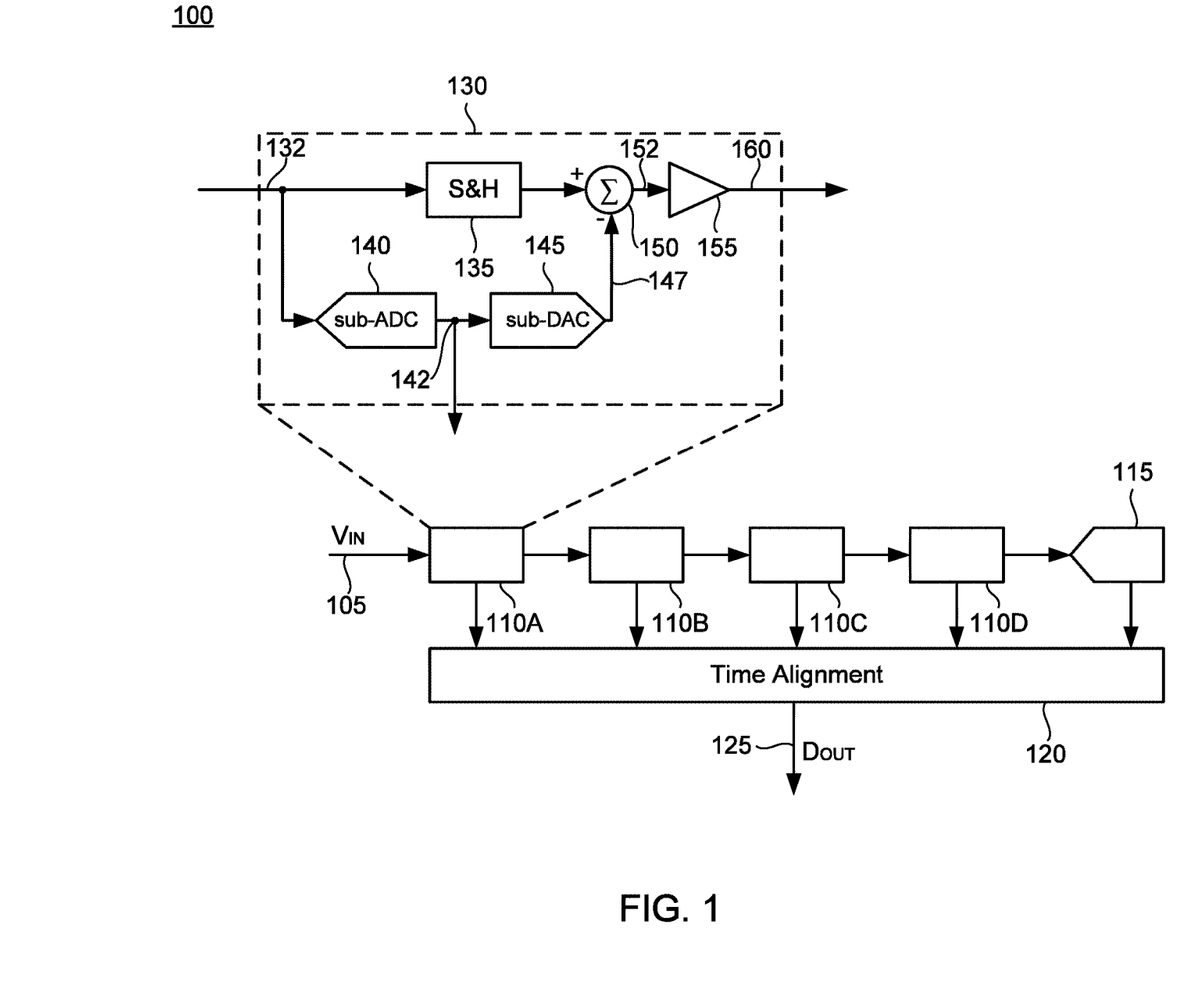
FIG. 1 illustrates a pipelined ADC according to some embodiments of the present disclosure.

FIG. 1 illustrates a pipelined ADC 100 according to some embodiments of the present disclosure. In pipelined ADC 100, an input voltage $V_{IN}$ 105 may be applied to the first stage 110A of the pipelined ADC 100. Each of the stages 110A-110D may include circuitry depicted in the exploded view of each stage 130. Within each stage 130, the input voltage 132 may be fed to a sample-and-hold circuit 135 and to sub-ADC 140. Sub-ADC 140 may convert the input voltage 132 to a digital output 142. In some embodiments, sub-ADC 140 may be a flash ADC with a resolution less than the resolution of the pipelined ADC 100 overall (common sub-ADC resolutions may be from 1 and 4 bits, but higher resolution sub-ADCs may be useful in some applications). This provides a coarse conversion of the input voltage 132 to digital output 142. The digital output 142 of sub-ADC 140 may be fed to time-alignment circuit 120 and also to sub-DAC 145, where it may be converted to an analog voltage 147. Analog voltage 147 may then be subtracted from the held version of the input voltage 132 in analog summer 150 to yield a residue 152 (sometimes called a remainder). The residue 152 therefore represents the difference between the input voltage 132 and the coarsely quantized version of input voltage 132. The residue 152 may be amplified by amplifier 155 to produce an output voltage 160, which may be fed to the next stage (110B-110D) or to the final stage sub-ADC 115. The functions of the sub-DAC 145, the analog summer 150, the amplifier 155, and, possibly, the sample-and-hold circuit 135 may be combined into a so-called "Multiplying DAC" (MDAC). The digital outputs for each of the stages 110A-110D, and the final stage sub-ADC 115, are fed into time alignment circuit 120 where the digital data is time aligned and assembled into a final digital output 125.

While FIG. 1 illustrates a pipelined ADC with four identical stages (110A-110D) plus a final stage that includes only a sub-ADC (115), those skilled in the art will readily appreciate that a pipelined ADC with any number of stages may be implemented without departing from the basic functionality of the pipelined ADC.

Figure 2:
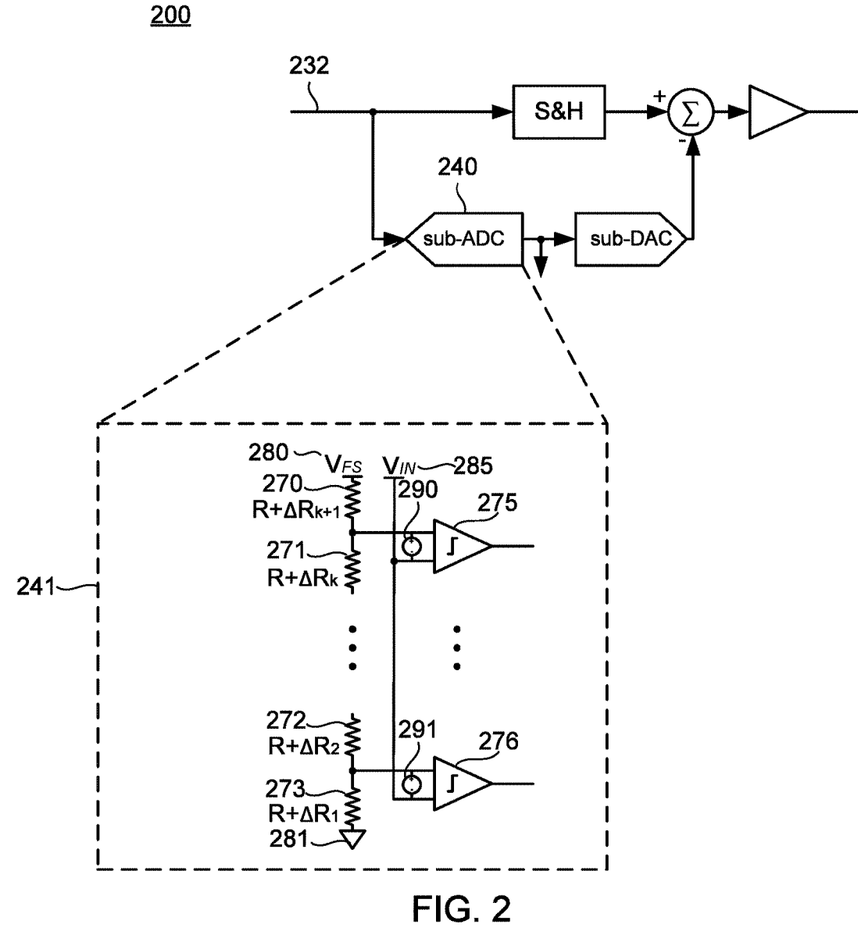
FIG. 2 illustrates a stage of a pipelined ADC according to some embodiment of the present disclosure.

FIG. 2 illustrates a stage 200 of a pipelined ADC according to an embodiment of the present disclosure. In FIG. 2, an exploded circuit view 241 of sub-ADC 240 is shown. As illustrated by exploded circuit view 241, in some embodiments, sub-ADC 240 may include a resistor ladder (for example, reference numbers 270, 271, 272, 273) that may be used to establish reference voltages and comparators (for example, reference numbers 275, 276). In a typical N-bit sub-ADC, $k=2^N-1$ comparators and k+1 resistors would be used. The top of the resistor ladder may be connected to a reference voltage $V_{FS}$ 280, representing the full-scale input voltage range of the sub-ADC. The bottom of the resistor ladder may be connected to a common or ground voltage 281. One input of each comparator may be connected in common to the input voltage $V_{IN}$ 285. In FIG. 2, offset voltage sources 290 and 291 may represent the combined effects of comparator input offset voltage and resistor ladder errors ($\Delta R_1$-$\Delta R_{k+1}$). Offset voltage sources 290 and 291 may also represent, in some embodiments, an adjustable threshold function for cancelling or mitigating the combined effects of comparator offset voltage and resistor ladder errors.

Figure 3:
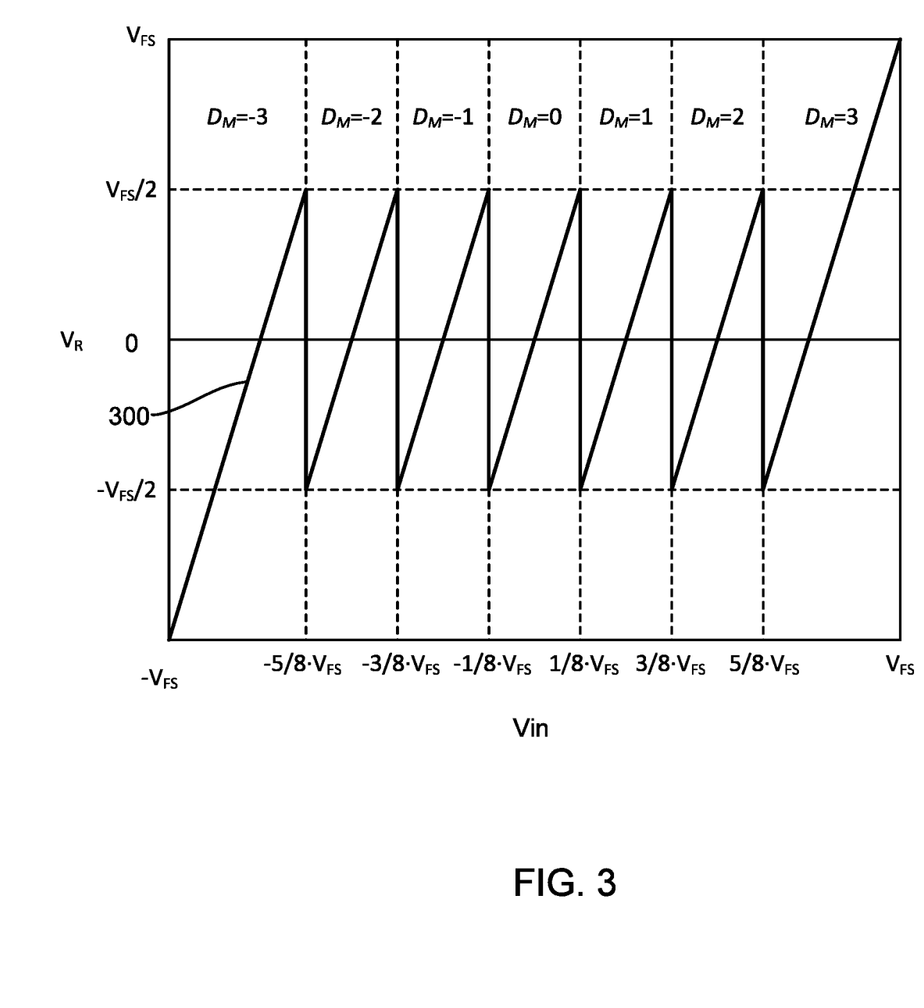
FIG. 3 illustrates an ideal residue plot of a Multiplying DAC (MDAC) that may be used in a pipelined ADC stage according to an embodiment of the present disclosure.

FIG. 3 illustrates an ideal residue plot 300 ($V_R$ vs. $V_{in}$) of a 2.5-bit Multiplying DAC (MDAC) that may be used in a pipelined ADC stage with ideal amplifier gain of 4.

Figure 4:
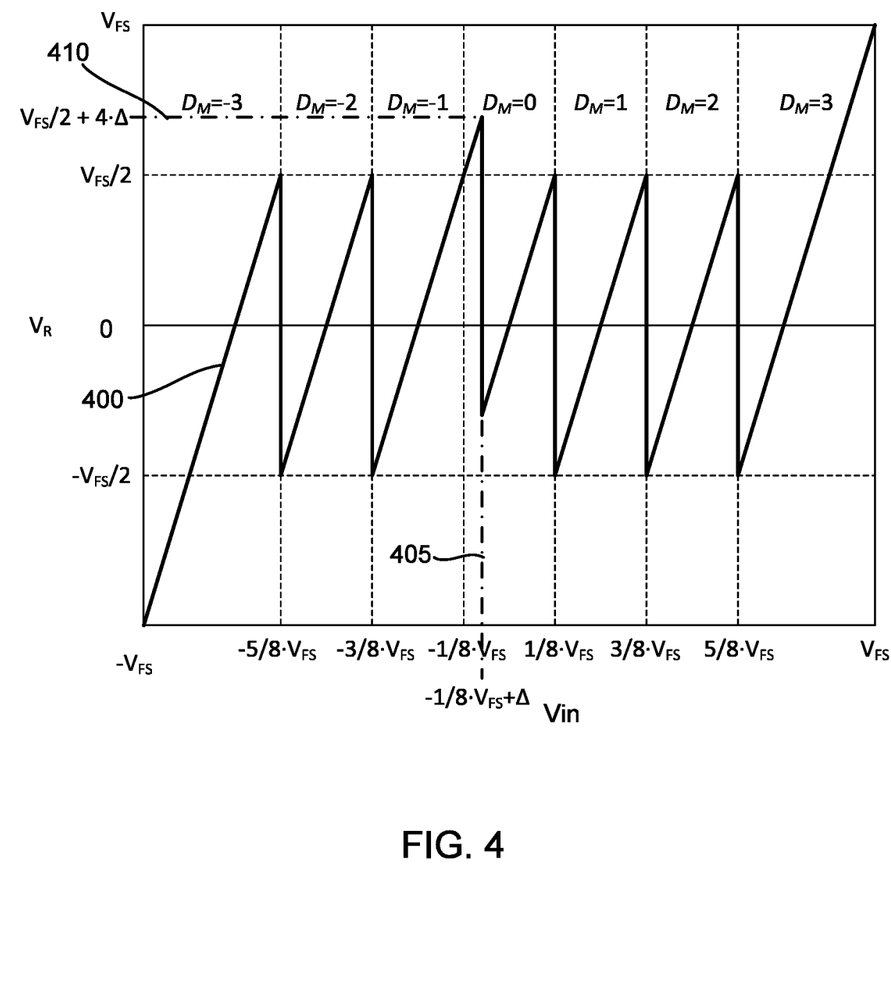
FIG. 4 illustrates another residue plot of a Multiplying DAC (MDAC) that may be used in a pipelined ADC stage according to an embodiment of the present disclosure.

FIG. 4 illustrates another residue plot 400 ($V_R$ vs. $V_{in}$) of a 2.5-bit Multiplying DAC (MDAC) that may be used in a pipelined ADC stage with ideal amplifier gain of 4. Residue plot 400 illustrates a situation where a comparator threshold may shift by, for example, +Δ (shown as reference number 405), in which case the residue voltage $V_R$ may increase by 4·Δ (shown as reference number 410). This shift may increase the linear range requirement of the gain stage (amplifier) in the MDAC. If the ADC architecture does not have digital redundancy, then a shift in the comparator thresholds will cause clipping of the next stage ADC. To avoid clipping, the input amplitude may be reduced from its full scale range.

In an embodiment, a system and method for calibration of a pipelined ADC measures and corrects the mismatch in a sub-ADC by detecting the threshold shift using sub-ADCs in subsequent stages and correcting for the shift by adjusting appropriate comparator offsets. This system and method may calibrate the sub-ADC without additional components in the signal path. The calibration process may be run in the background to overcome temperature and/or voltage variations without interrupting normal pipelined ADC operation. Noise-averaging may be applied to the threshold shift detection results (i.e. the comparator offsets may only be adjusted after a given number of shifts are detected). The calibration process may, in some embodiments, use only one detection circuit to detect threshold shift in any comparator in the sub-ADC and may adjust the comparator offsets serially to save area and number of control lines feeding back to the analog domain. The calibration process may, in some embodiments, be applied to multiple stages of the pipelined ADC. Use of the disclosed system and method for calibration of a pipelined ADC may effectively reduce the size of the resistor ladder and/or comparators to save power and area.

Figure 5:
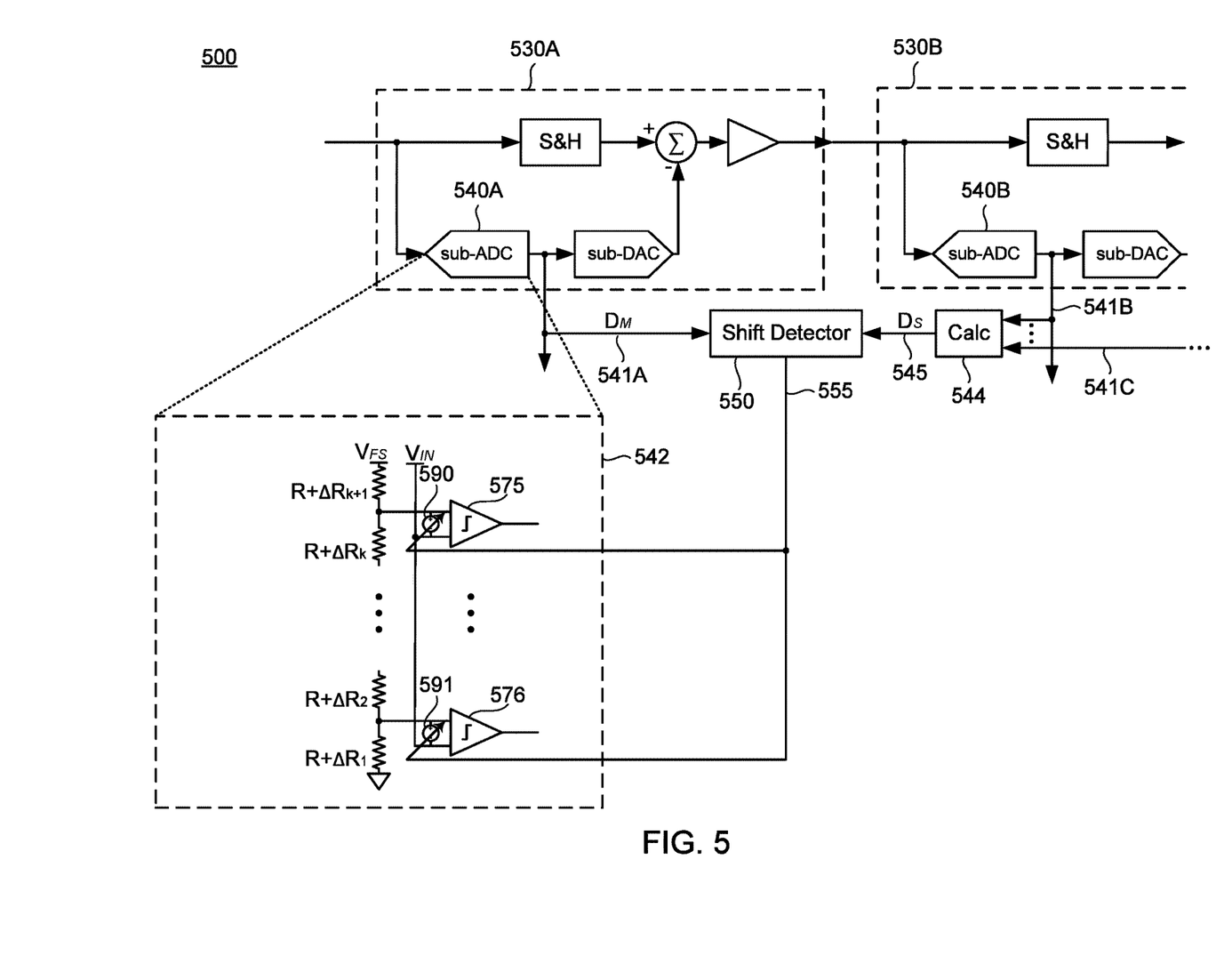
FIG. 5 illustrates an example functional and circuit diagram of a system and method for calibration of a pipelined ADC according to some embodiments of the present disclosure.

FIG. 5 illustrates an example functional and circuit diagram 500 of a system and method for calibration of a pipelined ADC according to some embodiments of the present disclosure. In FIG. 5, a pipelined ADC stage 530A includes, among other components, sub-ADC 540A. An exploded view 542 of sub-ADC 540A shows, among other circuit elements, comparators 575 and 576 and adjustable comparator offset voltage sources 590 and 591. Subsequent pipelined ADC stage 530B includes, among other components, sub-ADC 540B. Digital output levels 541B, 541C from subsequent pipelined ADC stages (530B and others not shown) may be combined (summed and aligned) in calc block 544 to produce combined digital output level $D_S$ 545. The digital output level $D_M$ 541A of sub-ADC 540A and combined digital output level $D_S$ 545 from calc block 544 may be input into shift detector 550. Shift detector 550 may use the combined digital output level $D_S$ 545 to determine when a threshold shift has occurred and may measure the polarity and the amount of the threshold shift. The digital output level $D_M$ 541A from sub-ADC 540A, may be used by shift detector 550 to determine which of the comparators in sub-ADC 540A have a threshold shift. Shift detector 550 may then provide output 555 to adjust one of the corresponding comparator thresholds (590 and 591, for example). Although FIG. 5 illustrates shift detector 550 and calc block 544 as dedicated to making adjustments on a specific stage of a pipelined ADC (pipelined ADC stage 530A, for example), some embodiments may have a single shift detector and calc block for all of the pipelined ADC stages. In such embodiments, the single shift detector and calc block may adjust the sub-ADC in each pipelined ADC stage in parallel (simultaneously), or may adjust the sub-ADC in each pipelined ADC stage in a serial or sequential manner. And although FIG. 5 illustrates two comparators (575 and 576) and four resistors in sub-ADC 540A, those skilled in the art will recognize that sub-ADC 540A may have any number of comparators and a corresponding number of resistors to set the reference voltages for the comparators.

Figure 6:
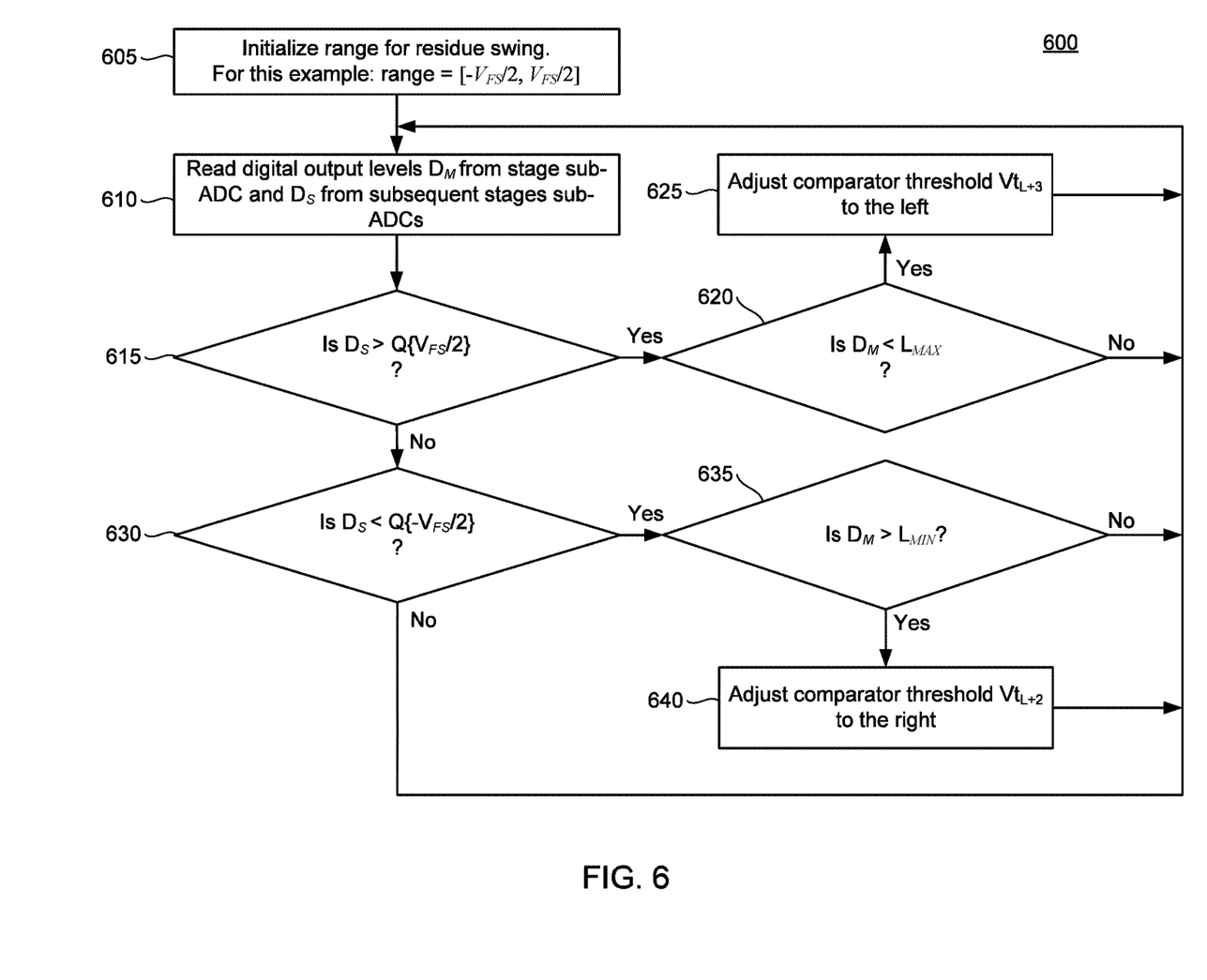
FIG. 6 illustrates a threshold shift detection process according to some embodiments of the present disclosure.
Figure 7:
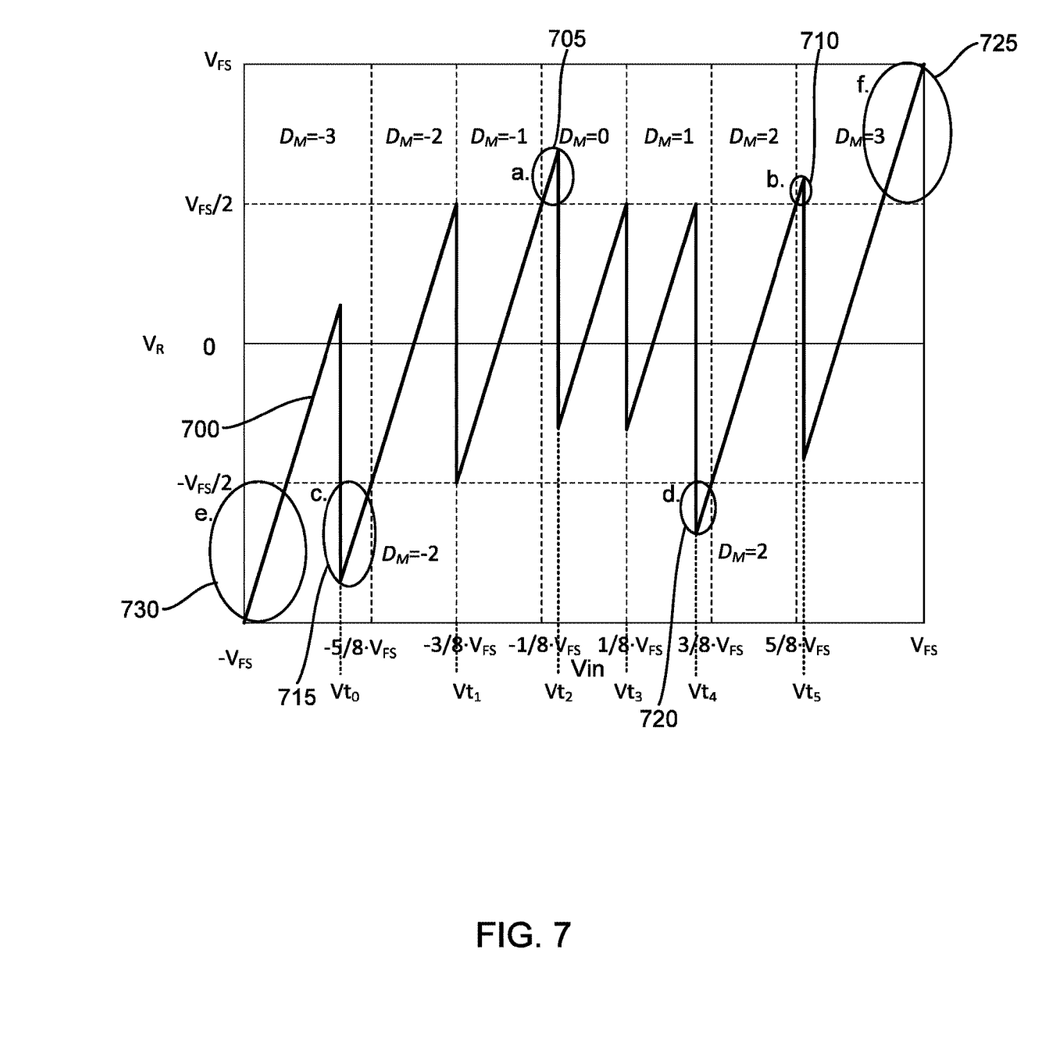
FIG. 7 illustrates another residue plot of a Multiplying DAC (MDAC) that may be used in a pipelined ADC stage according to an embodiment of the present disclosure.

FIG. 6 illustrates a threshold shift detection process 600 according to some embodiments of the present disclosure. In the description that follows, examples are provided with reference to FIG. 5 and FIG. 7. FIG. 7 illustrates another residue plot 700 ($V_R$ vs. $V_{in}$) of a 2.5-bit Multiplying DAC (MDAC) that may be used in a pipelined ADC stage with amplifier gain of 4. Residue plot 700 illustrates a number of examples (705, 710, 715, and 720) where a comparator threshold or resistor ladder may be shifted (from their ideal or nominal values) by various amounts.

Returning to FIG. 6, threshold shift detection process 600 begins at step 605, where a range for the residue ($V_R$) is initialized. The range defines the range or tolerance within which the residue swing is to be limited. The range can be adjusted based on design requirements (resolution, accuracy, etc.). In the examples of FIGS. 4 and 6, the residue swing may be limited to the range [$-V_{FS}/2$, $V_{FS}/2$].

In step 610, threshold shift detection process 600 reads the digital output level $D_M$ (541A in FIG. 5) from a sub-ADC (540A in FIG. 5) and combined digital output level $D_S$ (545 in FIG. 5) from the subsequent stages' sub-ADCs. In some embodiments, the reading of each of the digital output levels $D_M$ and $D_S$ may be timed such that the combined digital output level $D_S$ correspond to the same measurement as the digital output level $D_M$.

In step 615, threshold shift detection process 600 determines if $D_S > Q\{V_{FS}/2\}$, where $Q\{V_{FS}/2\}$ is the digitally quantized version of $V_{FS}/2$. If $D_S$ is greater than $Q\{V_{FS}/2\}$, this indicates that one of the comparator threshold voltages is high (caused by comparator offset voltage and/or resistor ladder inaccuracies). In FIG. 7, this is shown, for example as reference numbers 705 and 710. If $D_S$ is greater than $Q\{V_{FS}/2\}$, threshold shift detection process 600 continues to step 620, otherwise threshold shift detection process 600 continues to step 630.

In step 620, threshold shift detection process 600 determines if $D_M < L_{MAX}$. In the example shown in FIG. 7 (2.5 bit DAC), L can take the values: −3, −2, −1, 0, 1, 2, and 3. In this case, $L_{MAX}$ is 3. If $D_M < L_{MAX}$, then threshold shift detection process 600 continues to step 625, otherwise ($D_M = L_{MAX}$) threshold shift detection process 600 returns to step 610.

In step 625, threshold shift detection process 600 causes the comparator threshold $Vt_{L+3}$ (where L is the value of $D_M$) to be adjusted to the left (reducing the threshold voltage). Then, threshold shift detection process 600 returns to step 610.

In step 630, threshold shift detection process 600 determines if $D_S < Q\{-V_{FS}/2\}$ where $Q\{-V_{FS}/2\}$ is the digitally quantized version of $-V_{FS}/2$. If $D_S$ is less than $Q\{-V_{FS}/2\}$, this indicates that one of the comparator threshold voltages is low (caused by comparator offset voltage and/or resistor ladder inaccuracies). In FIG. 7, this is shown, for example as reference numbers 715 and 720. If $D_S$ is less than $Q\{-V_{FS}/2\}$, threshold shift detection process 600 continues to step 635, otherwise threshold shift detection process 600 returns to step 610.

In step 635, threshold shift detection process 600 determines if $D_M > L_{MIN}$. In the example shown in FIG. 7 (2.5 bit DAC), L can take the values: −3, −2, −1, 0, 1, 2, and 3. In this case, $L_{MIN}$ is −3. If $D_M > L_{MIN}$, then threshold shift detection process 600 continues to step 640, otherwise ($D_M = L_{MIN}$) threshold shift detection process 600 returns to step 610.

In step 640, threshold shift detection process 600 causes the comparator threshold $Vt_{L+2}$ (where L is the value of $D_M$) to be adjusted to the right (increasing the threshold voltage). Then, threshold shift detection process 600 returns to step 610.

Referring to the examples in FIG. 7, for case 705, $D_S > Q\{V_{FS}/2\}$ and $D_M = -1$, therefore $Vt_2$ will be adjusted to the left. For case 710, $D_S > Q\{V_{FS}/2\}$ and $D_M = 2$, therefore $Vt_5$ will be adjusted to the left. For case 715, $D_S < Q\{-V_{FS}/2\}$ and $D_M = -2$, therefore $Vt_0$ will be adjusted to the right. For case 720 $D_S < Q\{-V_{FS}/2\}$ and $D_M = 2$, therefore $Vt_4$ will be adjusted to the right. For case 725, $D_S > Q\{V_{FS}/2\}$ and $D_M = 3$ then no adjustment is necessary. For case 730, $D_S < Q\{-V_{FS}/2\}$ and $D_M = -3$ then no adjustment is necessary.

Figure 8:
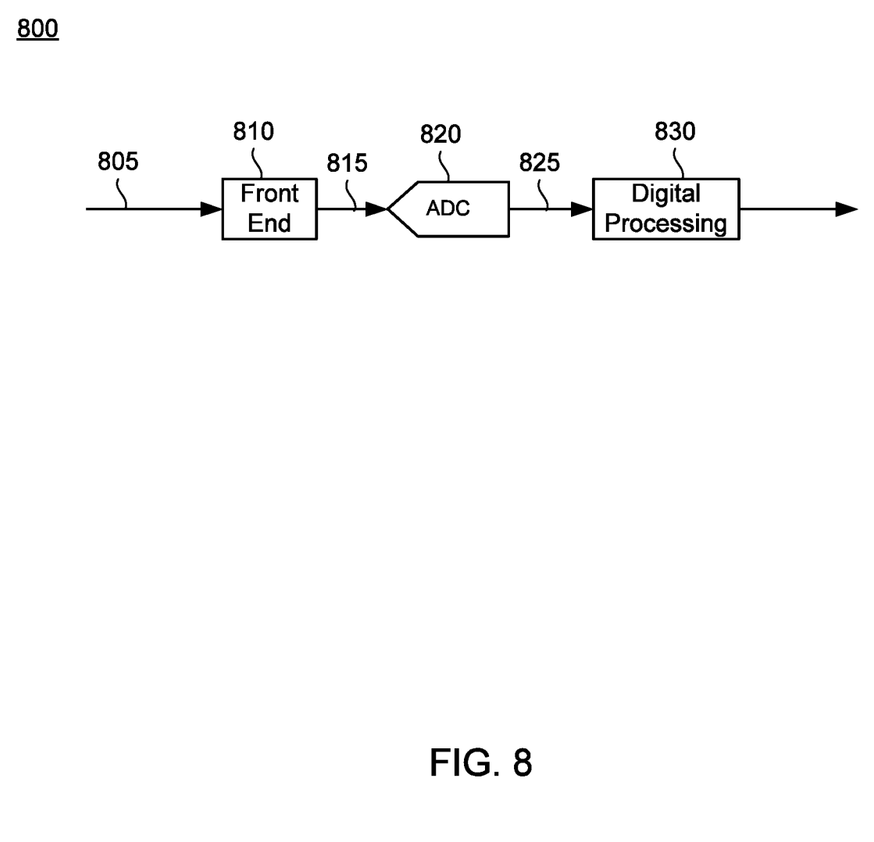
FIG. 8 illustrates a simplified functional block diagram of one class of applications (communication receiver) for a self-calibrating pipelined ADC according to some embodiments of the present disclosure.

FIG. 8 illustrates a simplified functional block diagram of one class of applications (communication receiver 800) for a self-calibrating pipelined ADC like that disclosed above. Communication receiver 800 may be part of a bidirectional communication system that may include a transmitter (not shown), or may be part of a stand-alone receiver (such as a broadcast television or radio receiver). In FIG. 8, an analog input signal 805 from, for example, an antenna, a coaxial cable, a fiber optic cable, a twisted pair cable, is fed into a front end circuit 810. Analog input signal 805 may be an RF or other high frequency carrier modulated with analog or digital information. Front end circuit 810 may include one or more low-noise amplifiers, tuners, mixers, filters, and the like. The output 815 from front end circuit 810 may be a baseband or intermediate frequency analog signal. The output 815 from front end circuit 810 may be fed into self-calibrating pipelined ADC 820 for conversion to digital form. Digital output 825 from self-calibrating pipelined ADC 820 may be fed into digital processing circuitry 830 for further processing in the digital domain.

Various embodiments of the invention are contemplated in addition to those disclosed hereinabove. The above-described embodiments should be considered as examples of the present invention, rather than as limiting the scope of the invention. In addition to the foregoing embodiments of the invention, review of the detailed description and accompanying drawings will show that there are other embodiments of the present invention. Accordingly, many combinations, permutations, variations and modifications of the foregoing embodiments of the present invention not set forth explicitly herein will nevertheless fall within the scope of the present invention.

The invention claimed is:

1. A method for calibrating a pipelined analog-to-digital converter (ADC) comprising:
   reading a first output level from a first sub-ADC;
   reading one or more additional output levels from one or more additional sub-ADCs;
   combining the one or more additional output levels from the one or more additional sub-ADCs into a combined output level; and
   adjusting a comparator threshold of the first sub-ADC when the first output level and the combined output level meet a set of predetermined conditions,
   wherein the comparator threshold of the first sub-ADC is reduced when the combined output level is above a first predetermined level and the first output level is below a second predetermined level and wherein the comparator threshold of the first sub-ADC is increased when the combined output level is below a third predetermined level and the first output level is above a fourth predetermined level.

2. The method of claim 1, wherein the first sub-ADC is in a first pipeline stage and the one or more additional sub-ADCs are in one or more additional pipeline stages following the first pipeline stage.

3. The method of claim 1, wherein the first sub-ADC includes two or more comparators, and the adjusting step further comprises selecting one of the two or more comparators prior to adjusting the comparator threshold of the selected comparator.

4. The method of claim 3, wherein the selecting of one of the two or more comparators is based on the first output level from the first sub-ADC.

5. The method of claim 1, further comprising the step of:
   repeating the two reading steps, the combining step and the adjusting step until the first output level is within a predetermined range.

6. A self-calibrating pipelined analog-to-digital converter (ADC) comprising:
   at least two pipeline stages, wherein each stage includes a sub-ADC; and
   circuitry coupled to the at least two pipeline stages, wherein the circuitry is configured to:
   read a first output level from a first sub-ADC;
   read one or more additional output levels from one or more additional sub-ADCs;

combine the one or more additional output levels from the one or more additional sub-ADCs into a combined output level; and adjust a comparator threshold of the first sub-ADC when the first output level and the combined output level meet a set of predetermined conditions, wherein the comparator threshold of the first sub-ADC is reduced when the combined output level is above a first predetermined level and the first output level is below a second predetermined level and wherein the comparator threshold of the first sub-ADC is increased when the combined output level is below a third predetermined level and the first output level is above a fourth predetermined level.

7. The self-calibrating pipelined analog-to-digital converter (ADC) of claim 6, wherein the first sub-ADC is in a first pipeline stage and the one or more additional sub-ADCs are in one or more additional pipeline stages following the first pipeline stage.

8. The self-calibrating pipelined analog-to-digital converter (ADC) of claim 6, wherein the first sub-ADC includes two or more comparators, and the circuitry is further configured to select one of the two or more comparators prior to adjusting the comparator threshold of the selected comparator.

9. The self-calibrating pipelined analog-to-digital converter (ADC) of claim 8, wherein the selection of one of the two or more comparators is based on the first output level from the first sub-ADC.

10. The self-calibrating pipelined analog-to-digital converter (ADC) of claim 6, wherein the circuitry is further configured to repeat the reading of the first output level, the combining of the one or more additional output levels and adjusting the comparator threshold until the first output level is within a predetermined range.

11. A communication receiver comprising:
a front-end circuit; and
a self-calibrating pipelined analog-to-digital converter (ADC) coupled to the front-end circuit comprising:
at least two pipeline stages, wherein each stage includes a sub-ADC;
circuitry coupled to the at least two pipeline stages, wherein the circuitry is configured to:
read a first output level from a first sub-ADC;
read one or more additional output levels from a one or more additional sub-ADCs;
combine the one or more additional output levels from the one or more additional sub-ADCs into a combined output level; and
adjust a comparator threshold of the first sub-ADC when the first output level and the combined output level meet a set of predetermined conditions,
wherein the comparator threshold of the first sub-ADC is reduced when the combined output level is above a first predetermined level and the first output level is below a second predetermined level and wherein the comparator threshold of the first sub-ADC is increased when the combined output level is below a third predetermined level and the first output level is above a fourth predetermined level.

12. The communication receiver of claim 11, wherein the first sub-ADC is in a first pipeline stage and the one or more additional sub-ADC are in one or more additional pipeline stages following the first pipeline stage.

13. The communication receiver of claim 11, wherein the first sub-ADC includes two or more comparators, and the circuitry is further configured to select one of the two or more comparators prior to adjusting the comparator threshold of the selected comparator.

14. The communication receiver of claim 11, wherein the circuitry is further configured to repeat the reading of the first output level, the combining of the one or more additional output levels and adjusting the comparator threshold until the first output level is within a predetermined range.

* * * * *